United States Patent [19]

Hirano

[11] Patent Number: 5,357,545
[45] Date of Patent: Oct. 18, 1994

[54] SYNCHRONIZING SIGNAL DETECTING CIRCUIT

[75] Inventor: Tomohisa Hirano, Tokyo, Japan

[73] Assignee: Sony Corporation, Tokyo, Japan

[21] Appl. No.: 892,283

[22] Filed: Jun. 2, 1992

[30] Foreign Application Priority Data

Jun. 7, 1991 [JP] Japan .................. 3-163675

[51] Int. Cl.⁵ .............. H04L 7/04; H04N 5/06; H03L 7/00
[52] U.S. Cl. .................. 375/111; 348/536; 348/540
[58] Field of Search ............ 358/148, 150, 153, 154, 358/158, 159, 319, 320; 375/113, 111; 348/531, 540, 541, 542, 536

[56] References Cited

U.S. PATENT DOCUMENTS

| | | |
|---|---|---|
| 4,024,571 | 5/1977 | Dischert et al. ............. 358/319 |
| 4,334,243 | 6/1982 | Srivastava ................... 358/153 |
| 4,870,297 | 9/1989 | Karlock ...................... 358/319 |

Primary Examiner—Stephen Chin
Assistant Examiner—Duane Kobayashi
Attorney, Agent, or Firm—Lewis H. Eslinger; Jay H. Maioli

[57] ABSTRACT

When supplied with an external synchronizing signal from an input terminal (2), a synchronizing separating circuit (6) separates and detects a horizontal synchronizing signal from the input signal and generates an HD pulse. When supplied with the HD pulse, a flip-flop (9) is set to generate a pulse. This output pulse is integrated by an integrating circuit (8) and an integrated output from the integrating circuit (8) is used to adjust a width of an output pulse from the flip-flop (9) to a value corresponding to a horizontal scanning frequency. The flip-flop (9) can be set only when supplied with the HD pulse, thereby preventing the flip-flop (9) from outputting a pulse whose width is longer than the width of the HD pulse. Therefore, the length of the back porch can be prevented from being reduced more than it is needed.

6 Claims, 3 Drawing Sheets

FIG. 5a HD 
FIG. 5b FF_9 (Q̄) 
FIG. 5c FF_7 (Q̄) 0 
FIG. 5d NAND 18 1 
FIG. 5e NOR 19 
FIG. 6a HD 
FIG. 6b FF_9 (Q̄) 1 
FIG. 6c FF_7 (Q̄) 1 
FIG. 6d NAND 18 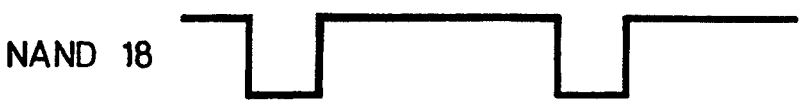
FIG. 6e NOR 19 

SYNCHRONIZING SIGNAL DETECTING CIRCUIT

BACKGROUND OF THE INVENTION

1. Field of the Invention

The present invention generally relates to synchronizing (sync.) signal detecting circuits and, more particularly, to a synchronizing signal detecting circuit which can be suitably applied to display units for computers, for example.

2. Description of the Prior Art

In some computers, a reference pulse R is inserted into a back porch of a pedestal portion of a synchronizing signal in a video signal output to the display unit as shown in FIG. 1, and the inserted reference pulse R is used to make a contrast of the display unit constant. When a predetermined signal such as the reference pulse R or the like is inserted into the back porch, if a length S of the sync. chip portion is increased too much, a length of the pedestal portion (i.e., a length F of a front porch and a length B of the back porch) is reduced relatively. There is then the risk that the reference pulse R cannot be inserted into the back porch. For this reason, in order to prevent the length of the back porch from being reduced too much, a conventional synchronizing signal detecting circuit controls the length of the sync. chip portion so that the length of the sync. chip portion corresponds to a horizontal scanning frequency (horizontal scanning frequencies are different depending upon types of computers).

FIG. 2 of the accompanying drawings shows in block form a circuit configuration of an example of a synchronizing signal detecting circuit according to the prior art.

Referring to FIG. 2, a synchronizing separating circuit 31 operates to separate and detect a synchronizing signal from an input signal and outputs a detected pulse. The detected pulse from the synchronizing separating circuit 31 is supplied to a pulse width adjusting circuit 32 and a frequency detecting circuit 33. The frequency detecting circuit 33 operates to detect a frequency of the detected pulse input thereto (i.e., the frequency of the horizontal synchronizing signal) and supplies a signal corresponding to the detected frequency to the pulse width adjusting circuit 32. The pulse width adjusting circuit 32 operates to adjust the width of the detected pulse input thereto from the synchronizing separating circuit 31 in response to the signal input thereto from the frequency detecting circuit 33. Thus, when the frequency becomes higher, the width of the detected pulse is reduced more, while when the frequency become lower, the width of the detected pulse is increased more.

Although the length S of the sync. chip portion of the video signal output from the computer substantially corresponds to a horizontal scanning frequency (when the frequency is higher, the length S of the sync. chip is selected to be shorter, while when the frequency is lower, the length S of the sync. chip portion is selected to be longer), depending on the types of computers, it is frequently observed that the length S of the sync. chip portion is set to be short as compared with those of other types of the computers having the same horizontal scanning frequency. In other words, the length S of the sync. chip portion is set to be short even though the frequency is comparatively low.

In such case, according to the conventional synchronizing signal detecting circuit, the length of the sync. chip portion is adjusted so as to become longer in response to the horizontal scanning frequency. Consequently, the length B of the back porch is reduced as shown by a phantom in FIG. 3, for example. There is then the risk that the reference pulse R cannot be inserted into the back porch.

OBJECTS AND SUMMARY OF THE INVENTION

Therefore, it is an object of the present invention to provide an improved synchronizing signal detecting circuit in which the aforesaid shortcomings and disadvantages of the prior art can be eliminated.

More specifically, it is an object of the present invention to provide a synchronizing signal detecting circuit which can prevent the length of a back porch from being reduced more than it is needed.

Another object of the present invention is to provide a synchronizing signal detecting circuit which can be suitably applied to display units for computers.

As an aspect of the present invention, a synchronizing signal detecting circuit comprises a synchronizing detecting unit for detecting a synchronizing signal from an input signal and detecting a detected pulse, a pulse width control unit for controlling a width of the detected pulse output from the synchronizing detecting unit so that the width of the detected pulse corresponds to a frequency, and a pulse width restricting unit for restricting the width of the detected pulse controlled by the pulse width control unit to a predetermined width.

The above and other objects, features, and advantages of the present invention will become apparent from the following detailed description of an illustrative embodiment thereof to be read in conjunction with the accompanying drawings, in which like reference numerals are used to identify the same or similar parts in the several views.

BRIEF DESCRIPTION OF THE DRAWINGS

FIGS. 5A-5E show a timing chart to which references will be made in explaining operation of the embodiment of FIG. 4 when an external synchronizing signal is input to the synchronizing signal detecting circuit; and FIGS. 6A-6E show a timing chart to which references will be made in explaining operation of the embodiment shown in FIG. 4 when an internal synchronizing signal is input to the synchronizing signal detecting circuit.

DETAILED DESCRIPTION OF THE PREFERRED EMBODIMENT

The present invention will now be described with reference to the accompanying drawings.

Figure 1:
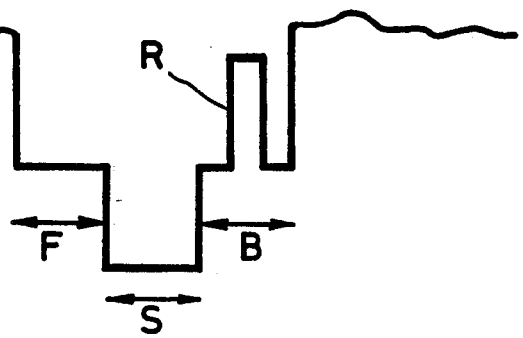
FIG. 1 is a diagram used to explain a reference pulse inserted into a back porch.
Figure 2:
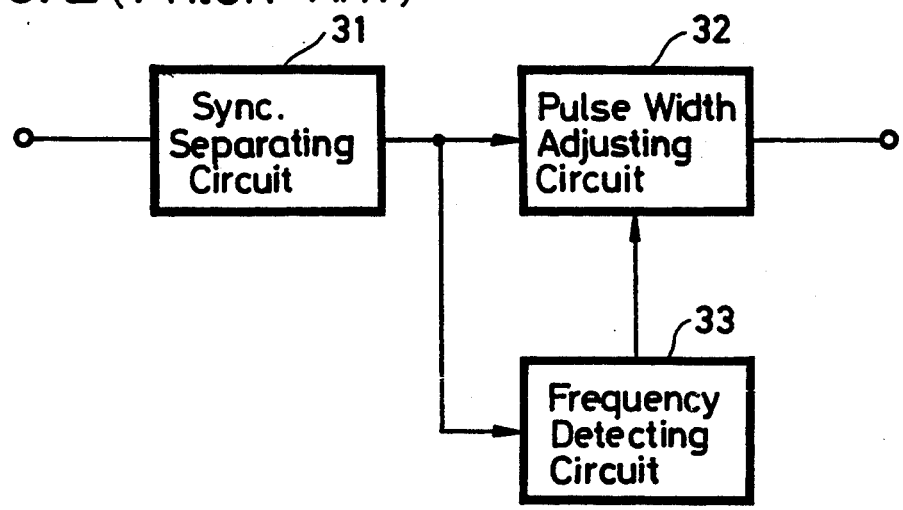
FIG. 2 is a block diagram showing a circuit configuration of an example of a synchronizing signal detecting circuit according to the prior art.
Figure 3:
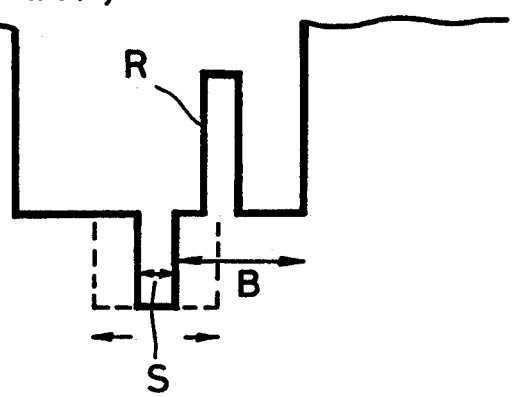
FIG. 3 is a diagram used to explain a disadvantage encountered with the conventional synchronizing signal detecting circuit of the example shown in FIG. 2.
Figure 4:
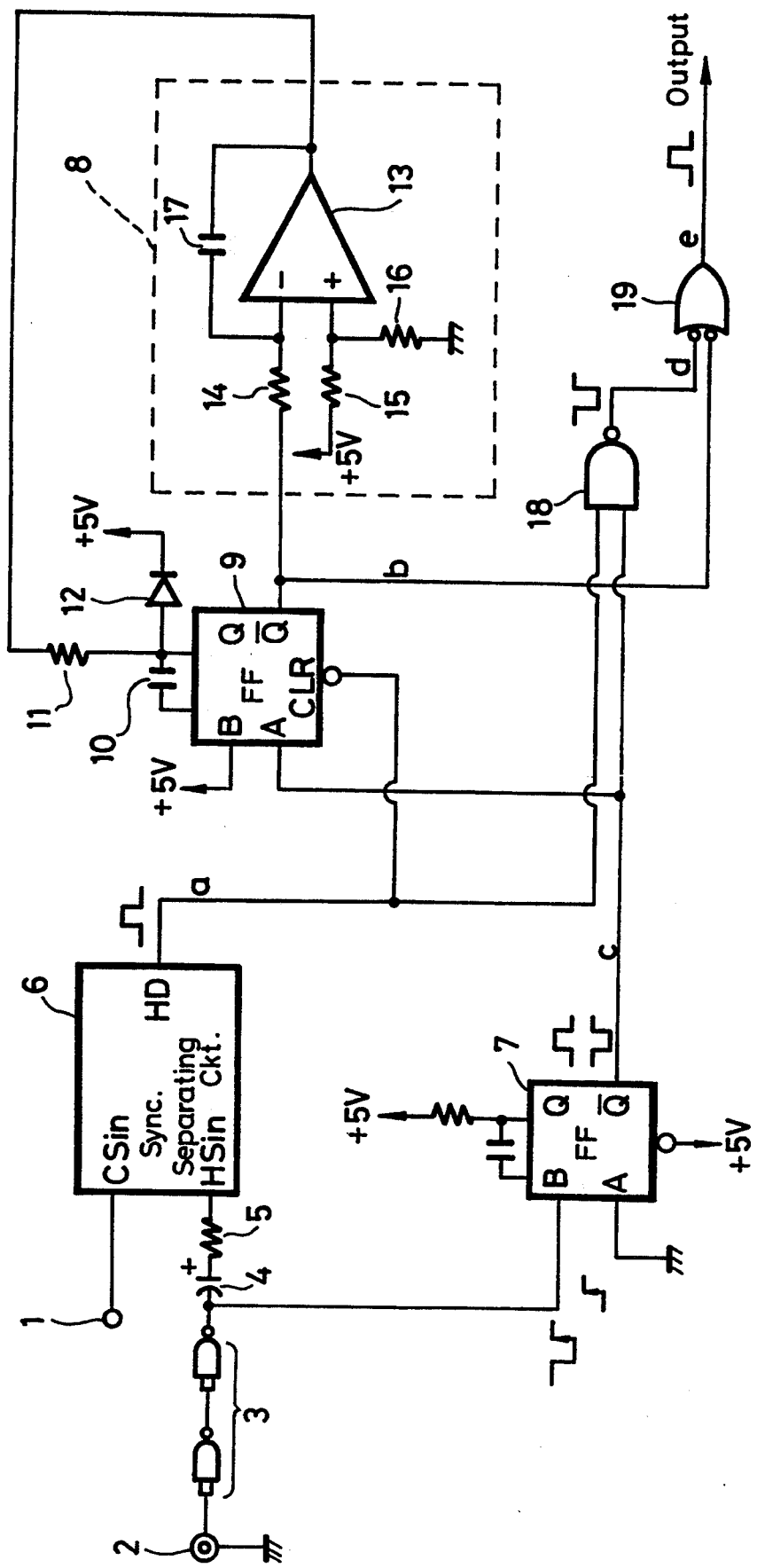
FIG. 4 is a block diagram showing a synchronizing signal detecting circuit according to an embodiment of the present invention.

FIG. 4 of the accompanying drawings shows in block form a circuit configuration of a synchronizing signal detecting circuit according to an embodiment of the present invention.

As shown in FIG. 4, a synchronizing signal separating circuit 6 is supplied with an internal synchronizing signal (e.g., a sync.-on-green signal in which a synchronizing signal is inserted into a G (green) signal) from an input terminal 1 and also supplied with an external synchronizing signal from an input terminal 2 through an inverter 3, a capacitor 4 and a resistor 5. The synchronizing signal separating circuit 6 operates to separate and detect a horizontal synchronizing signal from the input signal and generates a detected pulse (HD pulse).

The HD pulse from the synchronizing separating circuit 6 is supplied to a clear terminal CLR of a flip-flop (FF) 9 serving as a pulse width restricting means and one input of a NAND gate 18. A width of a pulse output from the flip-flop 9 is set to a predetermined value by a time constant circuit composed of a capacitor 10, a resistor 11 and a diode 12. This time constant circuit is controlled by an integrating circuit 8 which is composed of an operational amplifier 13, resistors 14 through 16 and a capacitor 17 so that the width of the pulse output from the flip-flop 9 corresponds to the frequency.

A time constant of a flip-flop (FF) 7 is set to a relatively large value (e.g., a value corresponding to a duration slightly longer than the cycle of the lowest horizontal scanning frequency). When supplied with the external synchronizing signal from the input terminal 2, the flip-flop 7 is retriggered to detect whether or not the external synchronizing signal is input to the input terminal 2. An output of the flip-flop 7 is supplied to the other input of the NAND gate 18 and also supplied to an input terminal A of the flip-flop 9. An output from the NAND gate 18 and an output from the flip-flop 9 are supplied through a NOR gate 19 to the succeeding circuit (not shown).

Operation of the synchronizing signal detecting circuit according to the embodiment of the present invention will be described also with reference to timing charts forming FIGS. 5 and 6.

When supplied with the external synchronizing signal from the input terminal 2, the flip-flop 7 is triggered by the input horizontal synchronizing signal to thereby output a low level signal (c in FIG. 5) at its inverting output terminal. Then, the flip-flop 7 is retriggered by the next horizontal synchronizing signal before its output is inverted to high level after a time corresponding to a time constant previously set is passed so that the output of the flip-flop 7 goes to low level during a period in which the external synchronizing signal is input thereto.

When supplied with the external synchronizing signal from the input terminal 2, the synchronizing separating circuit 6 separates and detects a horizontal synchronizing signal from the input signal and then generates an HD pulse ((a) in FIG. 5) in synchronism with the detected horizontal synchronizing signal. A pulse width of the HD pulse (high level period) corresponds to the width of the sync. chip portion involved in the input signal. Since the flip-flop 9 goes to high level at its clear terminal CLR during the period in which the HD pulse is high in level, the flip-flop 9 becomes operable and is cleared during the period in which the HD pulse is low in level.

The flip-flop 9 is supplied at its input terminal B with a high level signal and also supplied at its input terminal A with a signal of low level from the flip-flop 7. When supplied with the HD pulse and becomes operable, the flip-flop 9 is set to produce an inverted output of low level ((b) in FIG. 5). When no HD pulse is input to the flip-flop 9, the flip-flop 9 is cleared to produce an inverted output of high level ((b) in FIG. 5). A pulse output from the inverting output terminal of the flip-flop 9 is input to the integrating circuit 8 and is thereby integrated. An integrated voltage output from the integrating circuit 8 is supplied to a time constant circuit of the flip-flop 9 to control the time constant of the flip-flop 9, whereby the width of the pulse ((b) in FIG. 5) output from the flip-flop 9 is adjusted so as to become a value corresponding to the horizontal scanning frequency (frequency of the HD pulse). That is, when frequency becomes higher, the width of the pulse becomes shorter, while when the frequency becomes lower, the width becomes longer.

Incidentally, the flip-flop 9 is operable during the period in which the HD pulse is input thereto. Accordingly, the pulse width of the HD pulse can be adjusted in a range of the width of the HD pulse. Therefore, the width of the output pulse can be prevented from becoming longer than the width of the HD pulse (i.e., width of the sync, chip portion of the horizontal synchronizing signal in the external synchronizing signal).

The NAND gate 18 is supplied at one input thereof with the signal of low level from the flip-flop 7 and hence an output ((d) in FIG. 5) of the NAND gate 18 remains high in level. Since a NOR gate 19 is supplied at one input thereof with the output from the NAND gate 18, the NOR gate 19 inverts the output ((b) in FIG. 5) to produce its output ((e) in FIG. 5).

On the other hand, when the internal synchronizing signal is input to the input terminal 1, the synchronizing separating circuit 6 separates and detects a horizontal synchronizing signal from the input signal and outputs an HD pulse ((a) in FIG. 6). When the internal synchronizing signal is input to the input terminal 1, the external synchronizing signal is not input to the input terminal 2 so that an output ((c) in FIG. 6) at the inverting output terminal of the flip-flop 7 goes to high level. Thus, the NAND gate 18 inverts the HD pulse ((a) in FIG. 6) and produces an output ((d) in FIG. 6). Also, the flip-flop 9 is placed in its reset state and an output ((b) in FIG. 6) at the inverting output terminal of the flip-flop 9 remains high in level. Hence, the NOR gate 19 inverts the output of the NAND gate 18 to produce its output ((e) in FIG. 6).

As described above, according to the synchronizing signal detecting circuit of the present invention, the pulse width of the detected pulse is adjusted in response to the frequency. In this case, since the pulse width of the detected pulse is limited so as not to exceed the predetermined value, the back porch can be prevented from being reduced more than it is needed. Therefore, predetermined signals such as the reference pulse or the like can be correctly inserted into the back porch.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is;

1. A synchronizing signal detecting circuit comprising:

(a) synchronizing detecting means for detecting a synchronizing signal from an input signal and detecting a detected pulse;

(b) pulse width control means for controlling a width of the detected pulse output from said synchronizing detecting means so that the width of said detected pulse corresponds to a frequency of detected pulses in the synchronizing signal; and (c) pulse width restricting means connected to an output of said pulse width control means for restricting the width of said detected pulse controlled by said pulse width control means to a predetermined width.

2. The synchronizing signal detecting circuit according to claim 1, wherein said synchronizing detecting means is formed of a synchronizing separating circuit which is supplied with an internal synchronizing signal at a first input and an external synchronizing signal at a second input.

3. The synchronizing signal detecting circuit according to claim 1, wherein said pulse width control means is formed of an integrating circuit.

4. The synchronizing signal detecting circuit according to claim 3, wherein said integrating circuit is composed of an operational amplifier, a first resistor connected to a first input of said operational amplifier, second and third resistors connected to a second input of said operational amplifier and a capacitor connected between said first input and an output of said operational amplifier.

5. The synchronizing signal detecting circuit according to claim 1, wherein said pulse width restricting means is formed of a flip-flop.

6. The synchronizing signal detecting circuit according to claim 5, wherein a width of a pulse output from said flip-flop is controlled so as to become a predetermined value by a time constant circuit.

* * * * *